US009293626B2

(12) United States Patent
Jonak-Auer et al.

(10) Patent No.: US 9,293,626 B2
(45) Date of Patent: Mar. 22, 2016

(54) LATERAL AVALANCHE PHOTODIODE DEVICE AND METHOD OF PRODUCTION

(71) Applicant: ams AG, Unterpremstätten (AT)

(72) Inventors: Ingrid Jonak-Auer, Graz (AT); Jordi Teva, Eindhoven (NL)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/357,199

(22) PCT Filed: Oct. 22, 2012

(86) PCT No.: PCT/EP2012/070884
§ 371 (c)(1),
(2) Date: May 8, 2014

(87) PCT Pub. No.: WO2013/068227
PCT Pub. Date: May 16, 2013

(65) Prior Publication Data
US 2014/0312449 A1    Oct. 23, 2014

(30) Foreign Application Priority Data
Nov. 11, 2011    (EP) .................................. 11188873

(51) Int. Cl.
*H01L 31/107*    (2006.01)
*H01L 27/146*    (2006.01)
(Continued)

(52) U.S. Cl.
CPC ........ *H01L 31/107* (2013.01); *H01L 27/14609* (2013.01); *H01L 27/14634* (2013.01);
(Continued)

(58) Field of Classification Search
CPC ... H01L 31/107; H01L 31/0352; H01L 31/18; H01L 27/146

USPC ........................................................ 257/438
See application file for complete search history.

(56) References Cited

U.S. PATENT DOCUMENTS 3,886,579 A    5/1975 Ohuchi et al.
6,054,365 A *  4/2000 Lizotte .......................... 438/430
(Continued)

FOREIGN PATENT DOCUMENTS

DE         19621965 A1    12/1997
DE     102007037020 B3     8/2008
(Continued)

OTHER PUBLICATIONS

Chung, M-H. et al., "Lateral Si Avalanche Photodiode Fabricated Over an Etched Interdigital Mesa", Electronics Letters, vol. 26, No. 23, Nov. 8, 1990, pp. 1946-1947.

*Primary Examiner* — Karen Kusumakar
*Assistant Examiner* — Adam S Bowen
(74) *Attorney, Agent, or Firm* — McDermott Will & Emery LLP

(57) ABSTRACT

A lateral avalanche photodiode device comprises a semiconductor substrate (1) having a trench (4) with side walls (5) extending from a main surface (2) to a rear surface (3). A first doped region (11) is present at the side walls of the trench, and a second doped region (12) is arranged at a distance from the first doped region. A third doped region (13) is located adjacent to the first doped region, extends through the substrate from the main surface to the rear surface, and is arranged between the first doped region and the second doped region. The third doped region (13) is the avalanche multiplication region of the photodiode structure. The second doped region and the third doped region have a first type of conductivity, and the first doped region has a second type of conductivity which is opposite to the first type of conductivity. The region of the substrate that is between the first doped region and the second doped region is of the first type of conductivity.

15 Claims, 14 Drawing Sheets

(51) Int. Cl.
*H01L 31/0352* (2006.01)
*H01L 31/18* (2006.01)

(52) U.S. Cl.
CPC .... *H01L27/14689* (2013.01); *H01L 31/03529* (2013.01); *H01L 31/18* (2013.01); *H01L 31/1804* (2013.01); *Y02E 10/547* (2013.01)

(56) References Cited

U.S. PATENT DOCUMENTS

| | | | |
|---|---|---|---|
| 6,707,075 | B1 | 3/2004 | Rogers et al. |
| 6,943,409 | B1 * | 9/2005 | Cheng et al. ............... 257/330 |
| 8,258,594 | B2 | 9/2012 | Richter et al. |
| 2010/0084690 | A1 | 4/2010 | Adkisson et al. |
| 2010/0193893 | A1 | 8/2010 | Meinhardt et al. |
| 2011/0042769 | A1 | 2/2011 | Miura et al. |
| 2011/0183709 | A1 | 7/2011 | Roy |
| 2011/0241149 | A1 * | 10/2011 | Mazzillo et al. .............. 257/438 |
| 2014/0021572 | A1 | 1/2014 | Teva et al. |

FOREIGN PATENT DOCUMENTS

| | | |
|---|---|---|
| DE | 102011009373 A1 | 7/2012 |
| EP | 2256810 A1 | 12/2010 |
| WO | 02/29903 A2 | 4/2002 |

\* cited by examiner

LATERAL AVALANCHE PHOTODIODE DEVICE AND METHOD OF PRODUCTION

The invention relates to a lateral avalanche photodiode device, which is particularly suitable for a threedimensional integration with electronic components.

In U.S. Pat. No. 3,886,579 a vertical avalanche photodiode device is disclosed. The operation of an avalanche photodiode is based on the conversion of photon energy into free charge carriers and their further avalanche multiplication via impact ionization in a region of very high electric field strength. A reach-through avalanche photodiode device comprises a narrow region where a strong electric field is generated and the avalanche multiplication takes place and a broader region where the electric field strength is much lower and the incident radiation is absorbed. A reach-through avalanche photodiode device has the advantage that a satisfactory gain can be obtained at a relatively low operation voltage.

US 2010/0084690 A1 describes a CMOS image sensor cell formed on a p-type semiconductor substrate. A trench is filled with p-type polysilicon and surrounded by a p-type boundary layer. A vertical n-type collection region is formed immediately adjacent, surrounding the p-type boundary layer. In operation of the device, charge carriers are generated in a p-type area of the substrate, are collected in the n-type collection region, and pass through a channel into an n-type floating diffusion region. The channel is located in a p-type surface region adjacent to the n-type collection region, and a transfer gate electrode is arranged above the channel.

In US 2011/0183709 A1 an image sensor photodiode using deep and shallow trench isolations is disclosed. A deep trench isolation that is used in this device may comprise a conductive core. A voltage is applied to the core of the trench to reduce the dark current at the oxide-silicon interface and to repel charge carriers from the vicinity of the trench.

It is an object of this invention to provide a new avalanche photodiode device, which is particularly suitable for threedimensional integration.

This object is achieved with the lateral avalanche photodiode device according to claim 1 and with the method of production according to claim 11. Embodiments and alterations derive from the dependent claims.

The lateral avalanche photodiode device comprises a semiconductor substrate with a main surface and a rear surface opposite to the main surface. A trench with a side wall extends through the substrate from the main surface to the rear surface. A first doped region is present at the side wall of the trench, and a second doped region is arranged at a distance from the first doped region. A third doped region is located adjacent to the first doped region, extends through the substrate from the main surface to the rear surface, and is arranged between the first doped region and the second doped region. The second doped region and the third doped region have a first type of conductivity, and the first doped region has a second type of conductivity which is opposite to the first type of conductivity. The region of the substrate that is between the first doped region and the second doped region is of the first type of conductivity.

In an embodiment of the lateral avalanche photodiode device the third doped region extends through the substrate from the main surface to the rear surface, and the conductivity of the third doped region is higher than the conductivity of the substrate between the second doped region and the third doped region. In this embodiment the third doped region may particularly be provided as an avalanche multiplication region of elevated conductivity, making the avalanche photodiode a reach-through avalanche photodiode.

In a further embodiment of the lateral avalanche photodiode device the first type of conductivity is n-type conductivity and the second type of conductivity is p-type conductivity.

In a further embodiment the second doped region is arranged within the substrate at the main surface.

In a further embodiment a further trench with a side wall is present in the substrate, the second doped region is arranged at the side wall of the further trench, and the further trench and the second doped region extend through the substrate from the main surface to the rear surface.

In a further embodiment the main surface is planar, the first and second doped regions are rotationally symmetrical and coaxially arranged, and either the first doped region surrounds the second doped region or the second doped region surrounds the first doped region in at least one plane that is coplanar to the main surface.

In a further embodiment the trench divides the substrate into pixels.

In a further embodiment a first electrical contact is applied on the first doped region, and a second electrical contact is applied on the second doped region.

In a further embodiment a further substrate with an integrated circuit is arranged above the main surface, and the electrical contacts are electrically connected with the integrated circuit by means of interconnects leading through the further substrate.

A method of producing a lateral avalanche photodiode device, particularly the embodiments mentioned above, comprises the steps of providing a semiconductor substrate with a low doping of a first type of conductivity, forming a doped region of the first type of conductivity in the substrate, and forming, in any order of sequence, a first doped region and a second doped region. The latter is done by forming a trench with a side wall in the doped region, the trench extending through the substrate from a main surface to a rear surface, applying a doped polysilicon layer of a second type of conductivity which is opposite to the first type of conductivity to the side wall of the trench as the first doped region, and forming the second doped region of the first type of conductivity at a distance from the doped region. This is realized in such a way that a remaining portion of the doped region forms a third doped region adjacent to the first doped region, and the third doped region is arranged between the first doped region and the second doped region.

In embodiments the second doped region is formed by an implantation of a dopant for the first type of conductivity.

Before the trench is formed, a contact region of the second type of conductivity may be formed at the main surface within the doped region. The first doped region is arranged in electrical connection with the contact region.

In further embodiments a further trench is formed at a distance from the doped region, and a doped polysilicon layer of the first type of conductivity is applied to the side wall of the further trench as the second doped region. Before the trench is formed, a contact region of the second type of conductivity may be formed at the main surface within the doped region. The first doped region is arranged in electrical connection with the contact region of the second type of conductivity. Similarly, before the further trench is formed, a contact region of the first type of conductivity may be formed at the main surface at a distance from the doped region. The second doped region is arranged in electrical connection with the contact region of the first type of conductivity.

The following is a detailed description of exemplary embodiments and examples of the production method in conjunction with the appended figures.

Figure 1:
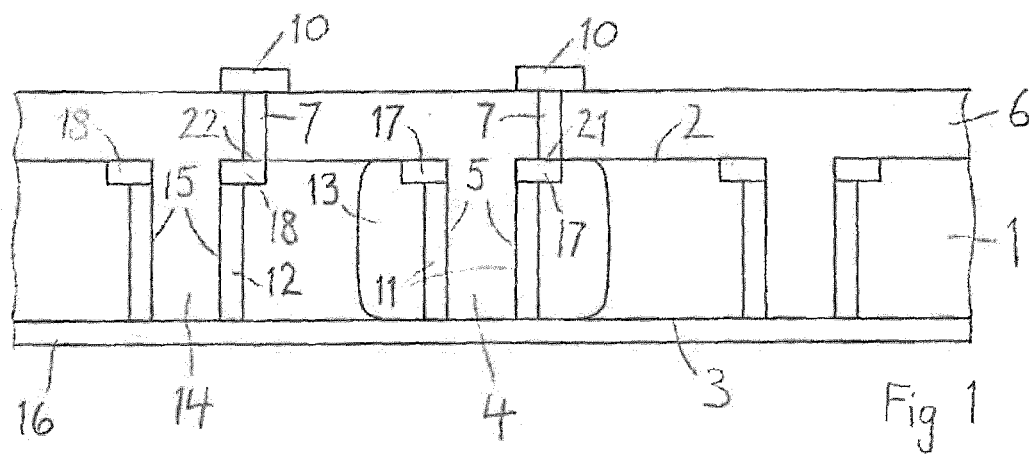
FIG. 1 shows a cross-section of an embodiment of the lateral avalanche photodiode device comprising trenches and contact regions in the substrate.

FIG. 1 shows a cross-section of an embodiment of a lateral avalanche photodiode device comprising a substrate 1 of a semiconductor material, which may be silicon, for example. The substrate 1 has a low doping of a first type of electrical conductivity, which may be an intrinsic conductivity of the semiconductor material. A first doped region 11 of a second type of conductivity which is opposite to the first type of conductivity and a second doped region 12 of the first type of conductivity are arranged at a distance from one another. A third doped region 13 of the first type of conductivity is arranged adjacent to the first doped region 11 and between the first doped region 11 and the second doped region 12. The first type of conductivity can be n-conductivity and the second type of conductivity p-conductivity or vice versa.

A trench 4 extends through the substrate 1 from a main surface 2 to a rear surface 3. In the following description and in the claims the term trench shall mean a recess or opening of any geometrical shape extending from the main surface 2 vertically into the substrate 1. The trench may thus be laterally omnidirectionally confined, especially rotationally symmetrical, or it may have a longitudinal extension in any direction parallel to the main surface 2. The first doped region 11 is arranged at a side wall 5 of the trench 4. The first doped region 11 may be formed within the semiconductor material of the substrate 1, or it may be applied as a separate doped layer on the side wall 5. In the third doped region 13 the electrical conductivity, which depends on the concentration of the dopant, is preferably larger than in the substrate region between the second doped region 12 and the third doped region 13. By a suitable adjustment of the doping concentration, the third doped region 13 can be provided as an avalanche multiplication region that is suitable for a reach-through avalanche photodiode.

A dielectric layer 6, especially a silicon dioxide layer, may be arranged on the main surface 2. The trench 4 may be filled with the material of the dielectric layer 6, as in the embodiment according to FIG. 1, or the first doped region 11 may instead occupy the entire volume of the trench 4. A passivation layer 16, which may comprise an antireflective coating for backside illumination or the like, may be applied to the rear side 3.

In the embodiment according to FIG. 1, a further trench 14 extends through the substrate 1 from the main surface 2 to the rear surface 3 at a distance from the third doped region 13. The second doped region 12 is arranged at a side wall 15 of the further trench 14. The second doped region 12 may be formed within the semiconductor material of the substrate 1, or it may be applied as a separate doped layer on the side wall 15 of the further trench 14. The material of the dielectric layer 6 may also fill the further trench 14, or the second doped region 12 may instead occupy the entire volume of the further trench 14.

Contact regions with a doping concentration that is suitable for an electrical contact, especially for a low-ohmic metal-semiconductor contact, may be provided for the first and second doped regions 11, 12. FIG. 1 shows an embodiment having a contact region 17 of the first doped region 11 and a contact region 18 of the second doped region 12. Vias 7 are arranged in the dielectric layer 6 on the main surface 2 and form a first electrical contact 21 on the contact region 17 of the first doped region 11 and a second electrical contact 22 on the contact region 18 of the second doped region 12. The vias 7 may be provided with contact pads 10 as shown in FIG. 1.

The lateral avalanche photodiode device may be provided for front or backside illumination. The photodiode device may form one pixel of a photodiode array. This is indicated in FIG. 1 by broken lateral contours and by the further trench structure shown on the right side.

Figure 2:
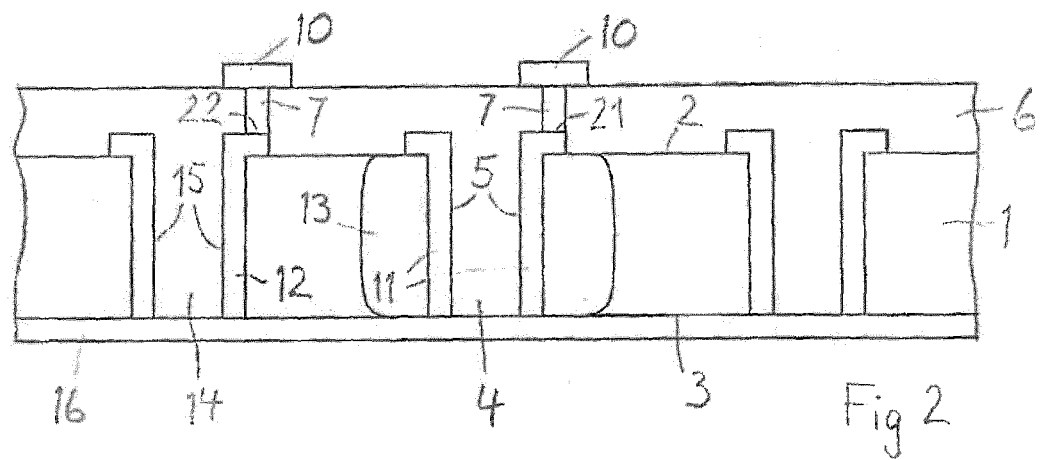
FIG. 2 shows a cross-section of an embodiment according to FIG. 1 without contact regions in the substrate.

FIG. 2 shows a cross-section of a further embodiment, which is similar to the embodiment according to FIG. 1. The corresponding elements of the embodiments according to FIGS. 1 and 2 are designated with the same reference numerals. In the embodiment according to FIG. 2 the layers forming the first doped region 11 and the second doped region 12 reach out of the trench 4 and the further trench 14, respectively, and form contact areas above the main surface 2 for the first electrical contact 21 and the second electrical contact 22. The contact region 17 of the first doped region 11 and the contact region 18 of the second doped region 12 are omitted.

Figure 3:
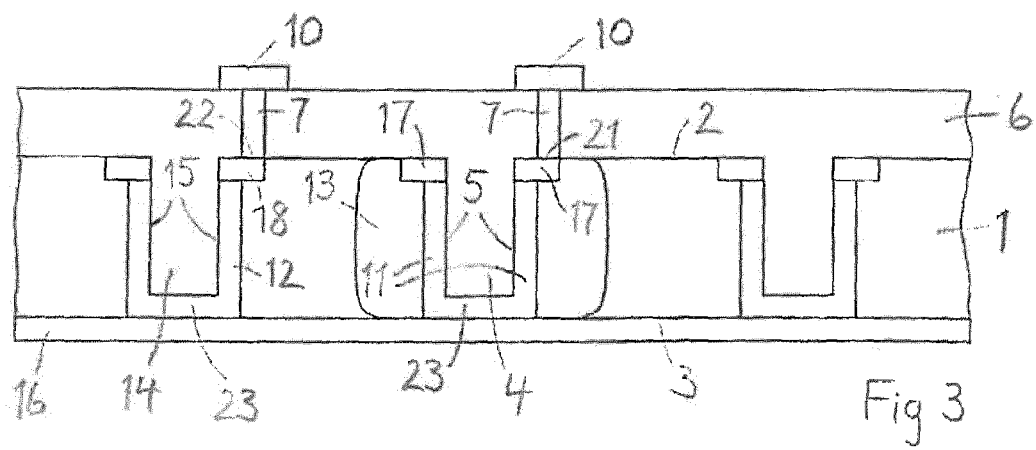
FIG. 3 shows a cross-section of an embodiment according to FIG. 1 with electrically conductive bottom layers in the trenches.

FIG. 3 shows a cross-section of a further embodiment, which is similar to the embodiment according to FIG. 1. The corresponding elements of the embodiments according to FIGS. 1 and 3 are designated with the same reference numerals. In the embodiment according to FIG. 3 the layers forming the first doped region 11 and the second doped region 12 are provided with electrically conductive bottom layers 23 of the corresponding types of conductivity. If doped layers are applied to the substrate 1 to form the first doped region 11 and the second doped region 12, the bottom layers 23 may be formed as portions of these layers. Even if there are separate, especially opposite, side walls of the same trench provided with doped regions, an electric potential is simultaneously applied to all doped side wall regions of the trench owing to the bottom layer 23. Separate doped regions which are arranged at different side walls of a trench which separates pixels of a photodiode array may thus easily be connected to a common ground terminal.

Figure 4:
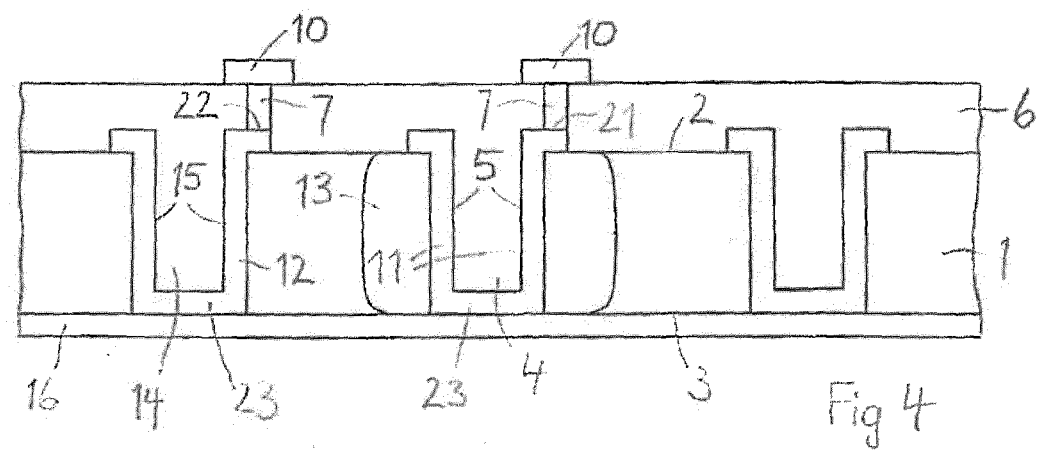
FIG. 4 shows a cross-section of an embodiment according to FIG. 2 with electrically conductive bottom layers in the trenches.

FIG. 4 shows a cross-section of a further embodiment, which is similar to the embodiment according to FIG. 2. The corresponding elements of the embodiments according to FIGS. 2 and 4 are designated with the same reference numerals. In the embodiment according to FIG. 4 the layers forming the first doped region 11 and the second doped region 12 comprise bottom layers 23 similar to the bottom layers 23 of the embodiment according to FIG. 3. The bottom layers 23 allow an electric potential to be simultaneously applied to all doped side wall regions of a trench, even if there are doped regions on separate, opposite side walls of the same trench.

Figure 5:
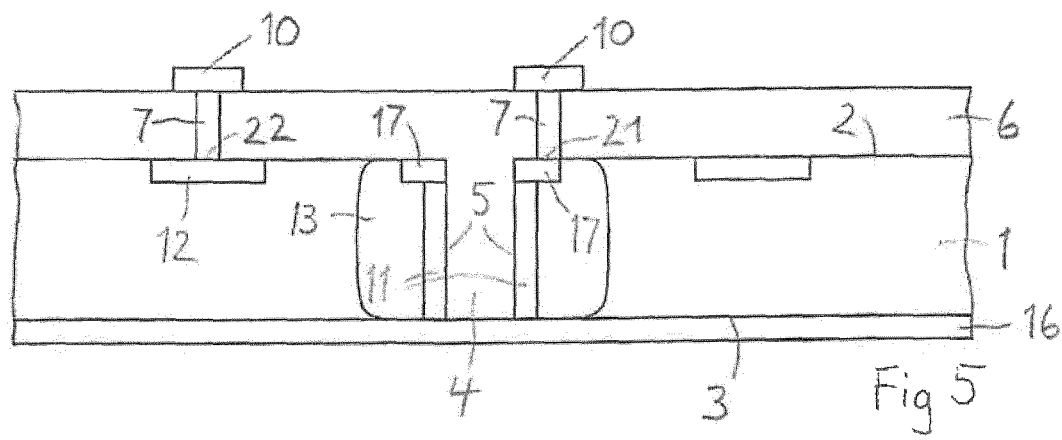
FIG. 5 shows a cross-section of a further embodiment of the lateral avalanche photodiode device according to FIG. 1.

FIG. 5 shows a cross-section of a further embodiment, which is similar to the embodiment according to FIG. 1. The corresponding elements of the embodiments according to FIGS. 1 and 5 are designated with the same reference numerals. In the embodiment according to FIG. 5 the second doped region 12 is arranged within the substrate 1 at the main surface 2 and may be produced by a masked implantation of a dopant into the main surface 2. If the doping concentration is sufficiently high, the second electrical contact 22 between the second doped region 12 and the appertaining via 7 has a low ohmic resistance. The contact region 18 of the second doped region 12 is omitted.

Figure 6:
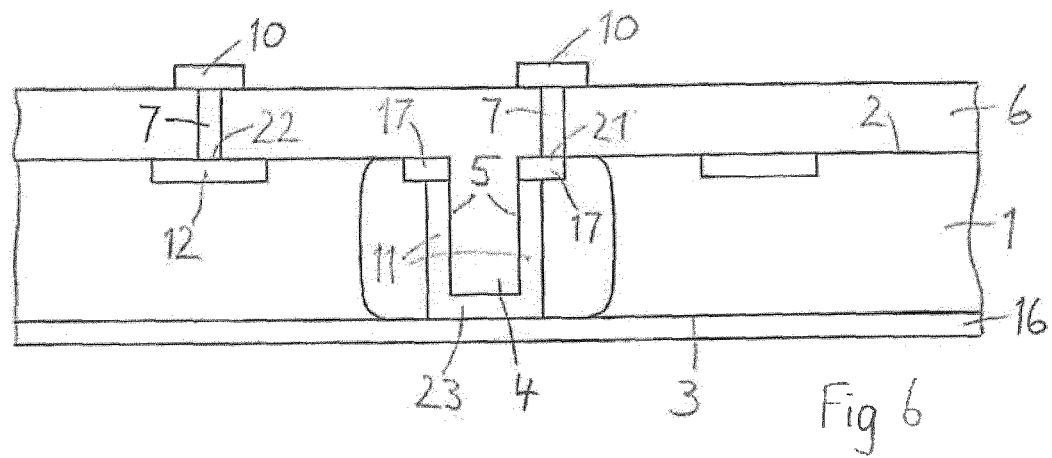
FIG. 6 shows a cross-section of an embodiment according to FIG. 5 with an electrically conductive bottom layer in the trench.

FIG. 6 shows a cross-section of a further embodiment, which is similar to the embodiment according to FIG. 5. The corresponding elements of the embodiments according to FIGS. 5 and 6 are designated with the same reference numerals. In the embodiment according to FIG. 6 the second doped region 12 is arranged within the substrate 1 at the main surface 2 and may be produced by a masked implantation of a dopant into the main surface 2. The concentration of the dopant is preferably sufficiently high for a low-ohmic second electrical contact 22 between the second doped region 12 and the appertaining via 7. In the embodiment according to FIG. 6 the layer forming the first doped region 11 comprises a bottom layer 23 similar to the bottom layers 23 of the embodiments according to FIGS. 3 and 4. This may be favorable if the trench 4 separates pixels of a photodiode array.

Figure 7:
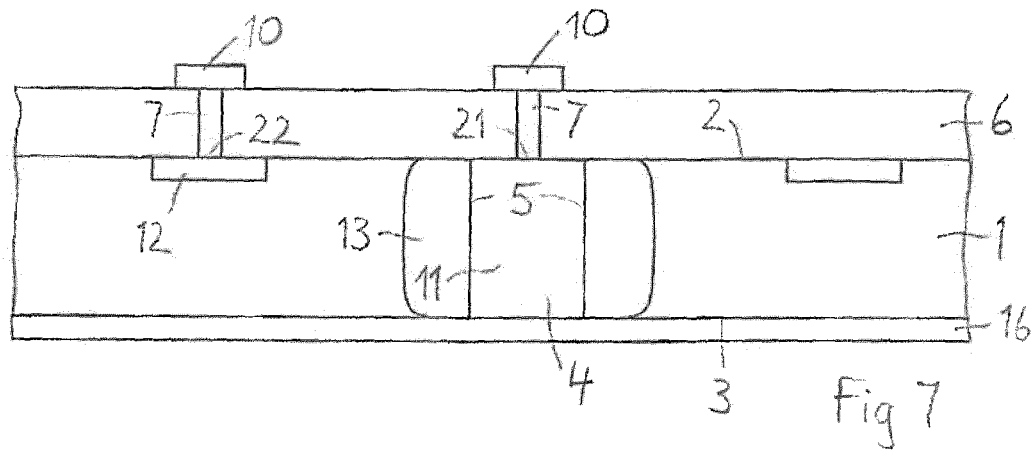
FIG. 7 shows a cross-section of an embodiment according to FIG. 5 with an electrically conductive filling of the trench.

FIG. 7 shows a cross-section of a further embodiment, which is similar to the embodiment according to FIG. 5. The corresponding elements of the embodiments according to FIGS. 5 and 7 are designated with the same reference numerals. In the embodiment according to FIG. 7 the second doped region 12 is arranged within the substrate 1 at the main surface 2 and may be produced by a masked implantation of a dopant into the main surface 2. The trench 4 is completely filled with the material of the first doped region 11. The contact region 17 of the first doped region 11 is omitted. The concentration of the dopant is preferably sufficiently high for a low-ohmic first electrical contact 21 between the first doped region 11 and the appertaining via 7. The same applies to the concentration of the dopant in the second doped region 12.

Figure 8:
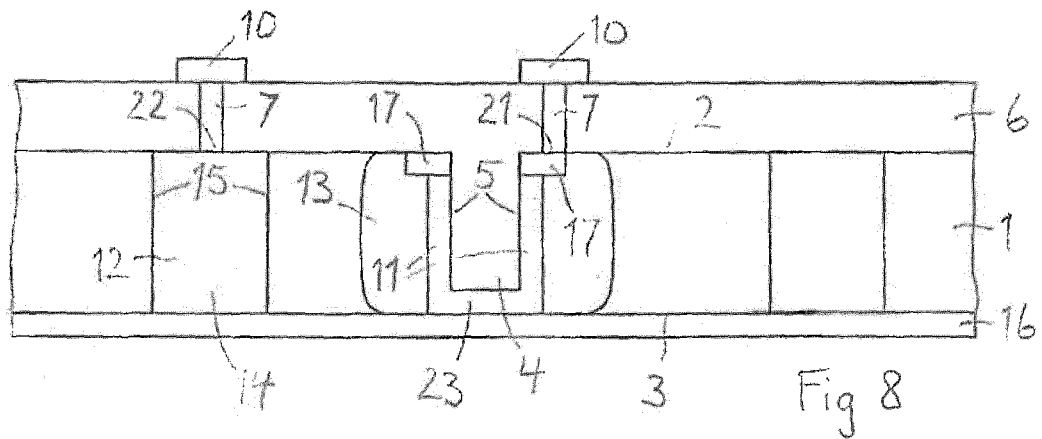
FIG. 8 shows a cross-section of an embodiment according to FIG. 3 with an electrically conductive filling of one of the trenches.

FIG. 8 shows a cross-section of a further embodiment, which is similar to the embodiment according to FIG. 1. The corresponding elements of the embodiments according to FIGS. 1 and 8 are designated with the same reference numerals. In the embodiment according to FIG. 8 the further trench 14 is completely filled with the material of the second doped region 12. The contact region 18 of the second doped region 12 is omitted. The concentration of the dopant is preferably sufficiently high for a low-ohmic second electrical contact 22 between the second doped region 12 and the appertaining via 7. In the embodiment according to FIG. 8 the layer forming the second doped region 12 comprises a bottom layer 23 similar to the bottom layers 23 of the embodiments according to FIGS. 3 and 4. This may be favorable if the further trench 14 separates pixels of a photodiode array.

Figure 9:
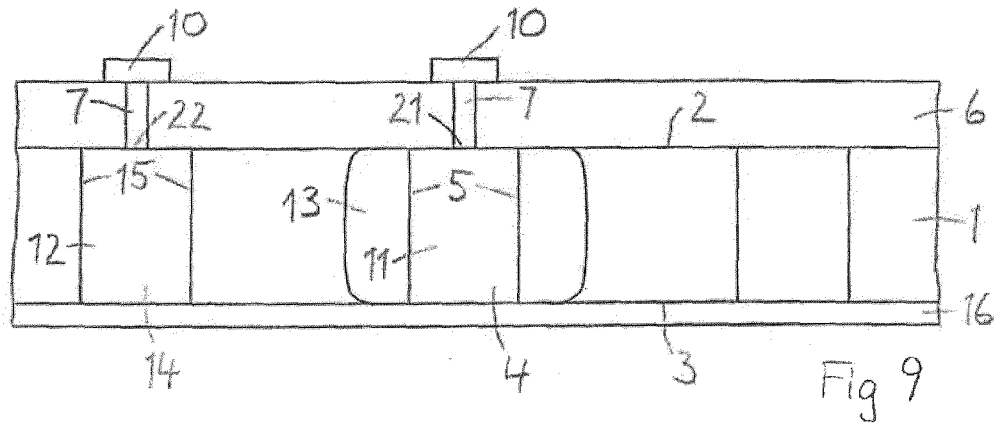
FIG. 9 shows a cross-section of an embodiment according to FIG. 1 with electrically conductive fillings of the trenches.

FIG. 9 shows a cross-section of a further embodiment, which is similar to the embodiment according to FIG. 7. The corresponding elements of the embodiments according to FIGS. 7 and 9 are designated with the same reference numerals. In the embodiment according to FIG. 9 the trench 4 is completely filled with the material of the first doped region 11, and the further trench 14 is completely filled with the material of the second doped region 12. The contact region 17 of the first doped region 11 and the contact region 18 of the second doped region 12 are omitted. The doping concentrations are preferably sufficiently high for low-ohmic first and second electrical contacts 21, 22 between the doped regions 11, 12 and the appertaining vias 7.

From the preceding description of several exemplary embodiments it will be clear that features of different embodiments can be combined to render new embodiments, which are within the scope of the invention. Common features are the presence of at least one trench with a side wall extending through the substrate from the main surface to the rear surface, and a first doped region arranged at the side wall of the trench, the substrate having the opposite type of conductivity.

Figure 10:
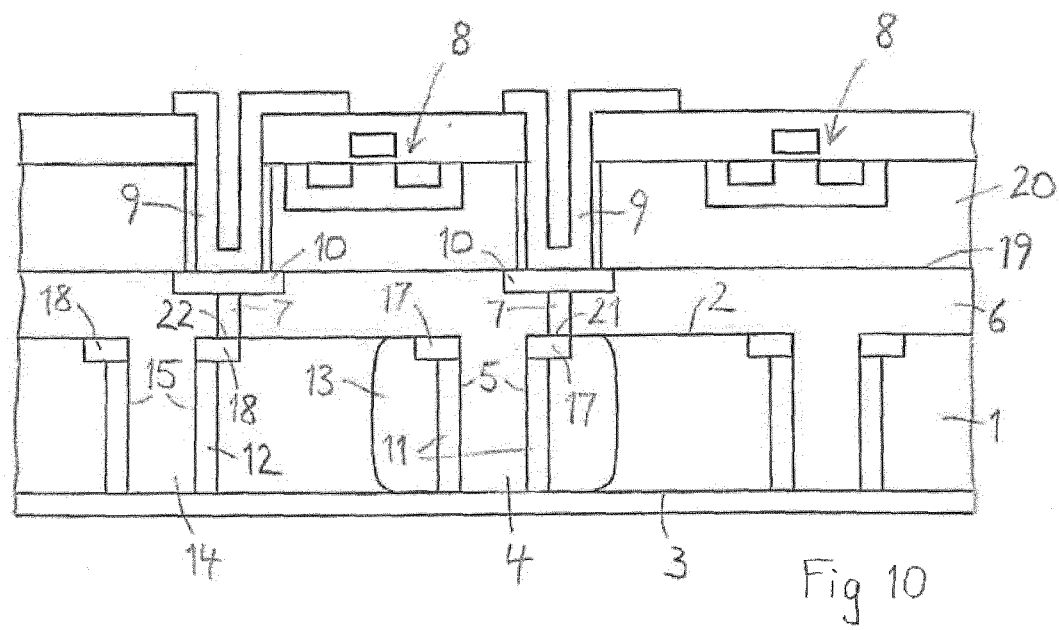
FIG. 10 shows a cross-section of an embodiment according to FIG. 1 in an arrangement of threedimensional integration with a further substrate.

FIG. 10 shows a cross-section of an embodiment according to FIG. 1 in an arrangement of threedimensional integration with a further substrate 20, which may be bonded by the dielectric layer 6 or by an additional connection layer 19. The further substrate 20 may be provided with an integrated circuit 8. Interconnects 9, which may be formed as through-substrate vias, are provided in the further substrate 20 to connect the contact pads 10 with terminals of the integrated circuit 8. The structure of the further substrate 20 is not in any way restricted by this kind of integration, and hence the connections are not shown in detail. The threedimensional arrangement is intended for backside illumination, the radiation entering the photodiode through the rear surface 3. The other embodiments of the lateral avalanche photodiode device can be integrated with a further substrate 20 in a similar fashion.

Figure 11:
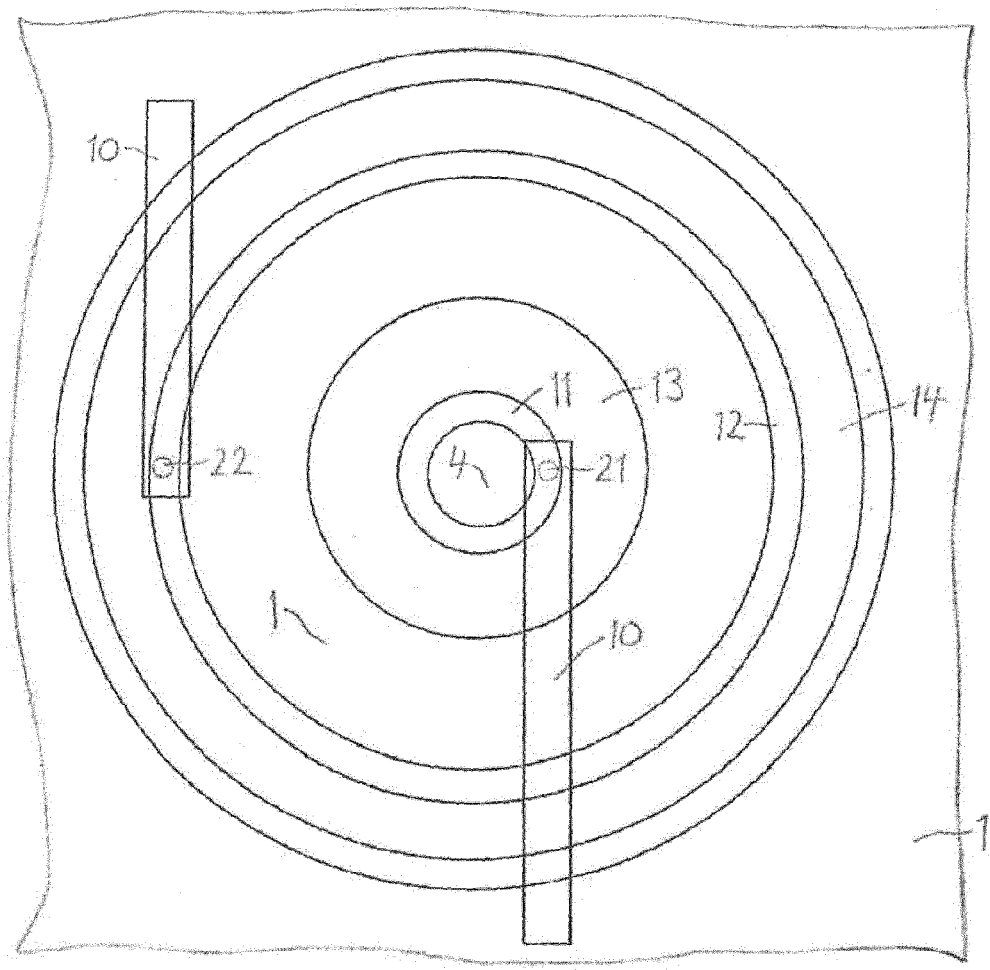
FIG. 11 shows a plan view of an embodiment according to FIG. 1 or FIG. 2.

FIG. 11 shows a plan view of an embodiment according to FIG. 1 or 2. The corresponding elements are designated with the same reference numerals. The contours are shown as if the dielectric layer 6 and the contact pads 10 were transparent. The embodiment according to FIG. 11 comprises a single photodiode, in which the trench 4 is centrally arranged and surrounded by the further trench 14. The trench 4 may be cylindrical, and the further trench 14 may have the shape of a cylinder barrel. Instead, the further trench 14 may be arranged in the centre and surrounded by the trench 4. In the latter case the first doped region 11 and the third doped region 13 may have the shape of cylinder barrels, which are arranged at the inner side wall of the trench 4. The contact pads 10 may be formed as local pads or as conductor tracks, for example.

Figure 12:
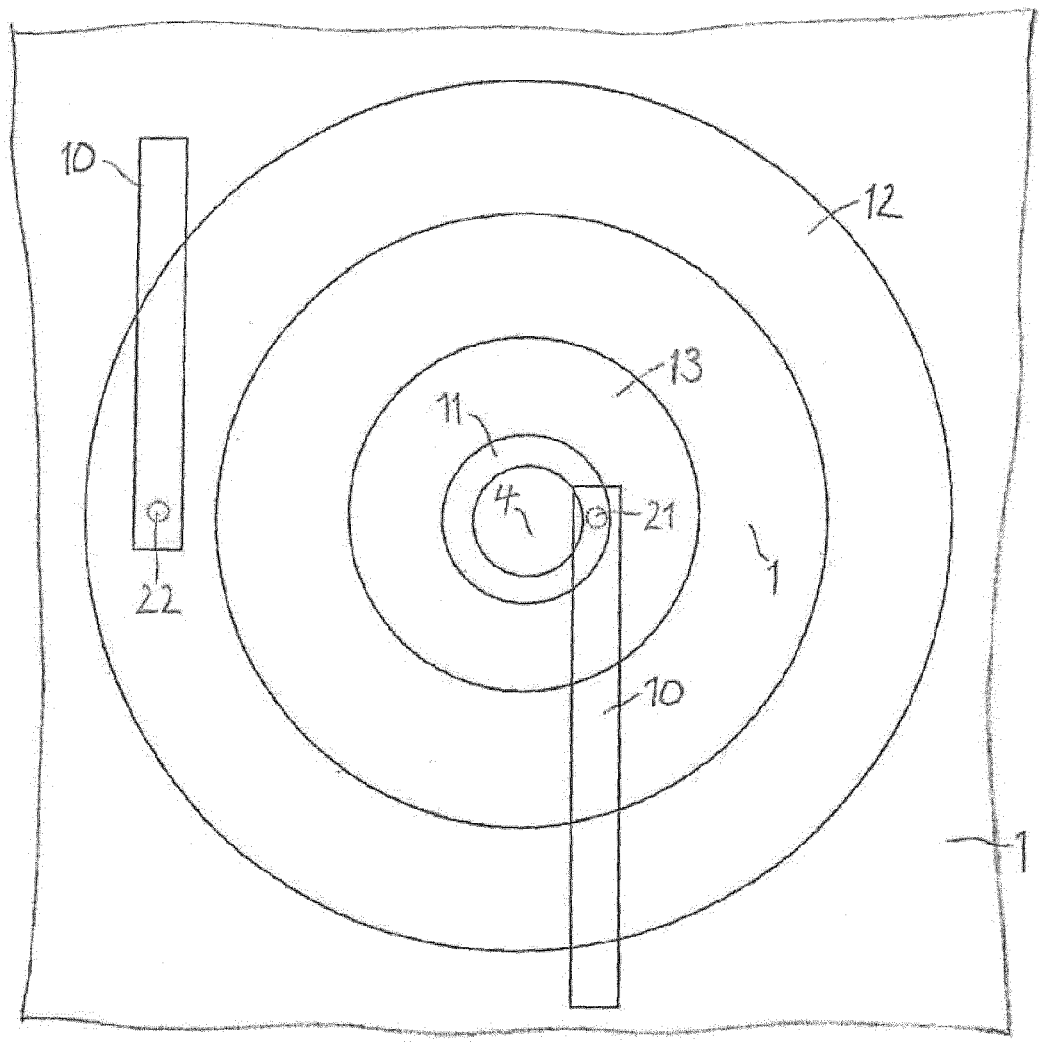
FIG. 12 shows a plan view of an embodiment according to FIG. 5.

FIG. 12 shows a plan view of an embodiment according to FIG. 5. The corresponding elements are designated with the same reference numerals. The contours are shown as if the dielectric layer 6 and the contact pads 10 were transparent. The embodiment according to FIG. 12 comprises a single photodiode, in which the trench 4 is centrally arranged and surrounded by the second doped region 12. The trench 4 may be cylindrical, and the second doped region 12 may have the shape of a ring. Instead, the second doped region 12 may be arranged in the centre and surrounded by the trench 4. In the latter case the first doped region 11 and the third doped region 13 may have the shape of cylinder barrels, which are arranged at the inner side wall of the trench 4. The contact pads 10 may be formed as local pads or as conductor tracks, for example.

Figure 13:
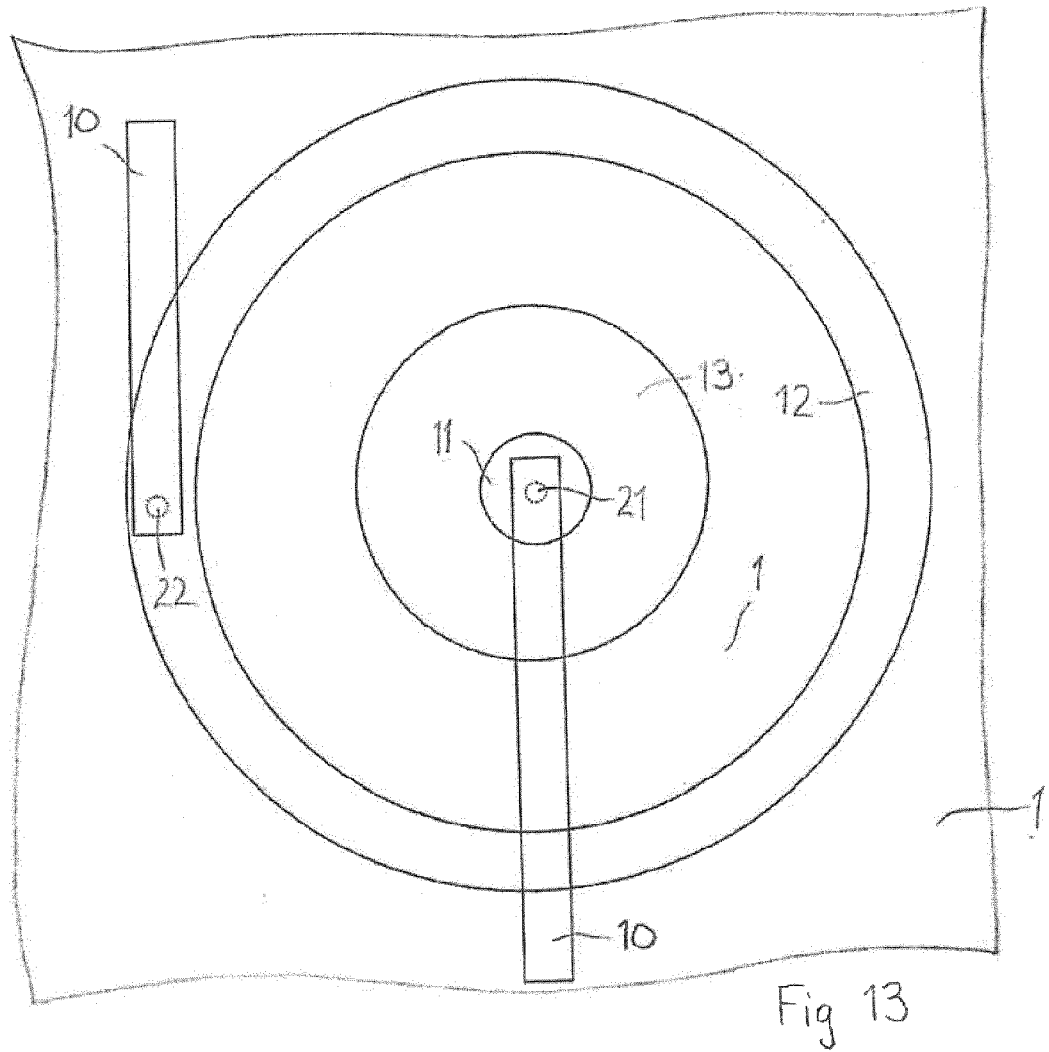
FIG. 13 shows a plan view of an embodiment according to FIG. 9.

FIG. 13 shows a plan view of an embodiment according to FIG. 9. The corresponding elements are designated with the same reference numerals. The contours are shown as if the dielectric layer 6 and the contact pads 10 were transparent. The embodiment according to FIG. 13 comprises a single photodiode, in which the trench 4 is centrally arranged and surrounded by the further trench 14, and both trenches 4, 14 are filled with the material of the first and second doped regions 11, 12. The trench 4 may be cylindrical, and the further trench 14 may have the shape of a cylinder barrel. Instead, the further trench 14 may be arranged in the centre and surrounded by the trench 4. In the latter case the first doped region 11 and the third doped region 13 may have the shape of cylinder barrels, which are arranged at the inner side wall of the trench 4. The contact pads 10 may be formed as local pads or as conductor tracks, for example.

The described lateral avalanche photodiode device enables the realization of photodiode arrays with extremely small pixels. It is therefore well suited for applications in image detection, for instance. A good separation between neighboring pixels is obtained without application of further means just by the arrangement of isolating trenches as described.

Figure 14:
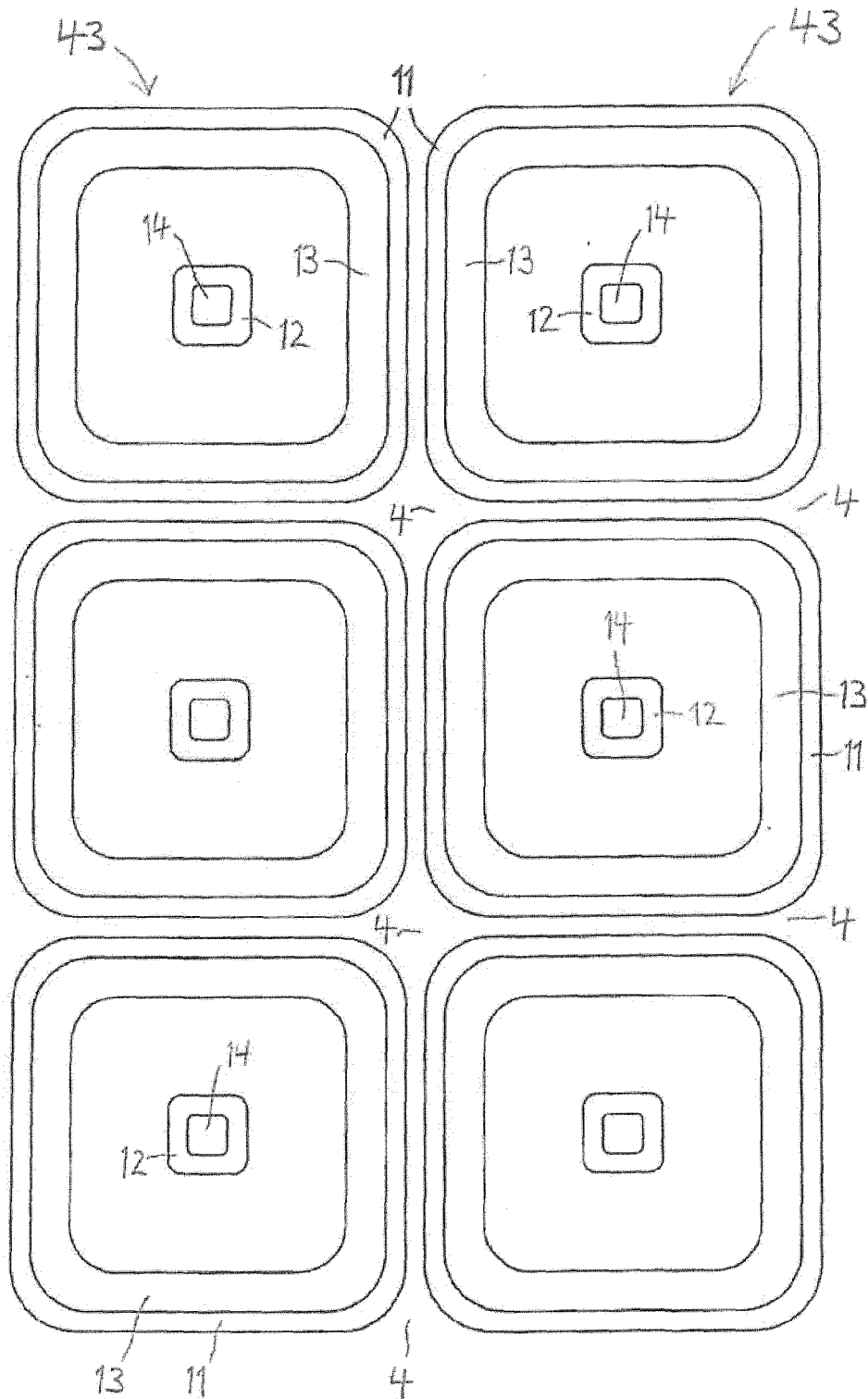
FIG. 14 shows a plan view of an array of photodiodes.

FIG. 14 shows a plan view of an array of photodiodes. In this example, the individual photodiodes each comprise a trench 4 and a further trench 14 according to the embodiments of FIGS. 1 to 4. The further trenches 14 are arranged in the centres of the pixels 43. The trench 4 is common to all the photodiodes of the array and subdivides the substrate 1 into the pixels 43. The trench 4 may have a structure that appears in the plan view as a double grating formed by two orthogonally intersecting arrangements of single straight trenches that are parallel to one another. Instead, trenches 4 and adjacent first doped regions 11 and third doped regions 13 may be arranged in the centres of the pixels 43 and surrounded by the common further trench 14. The array of photodiodes may comprise any of the embodiments described above. Different embodiments and features thereof may be combined according to individual requirements.

Figure 15:
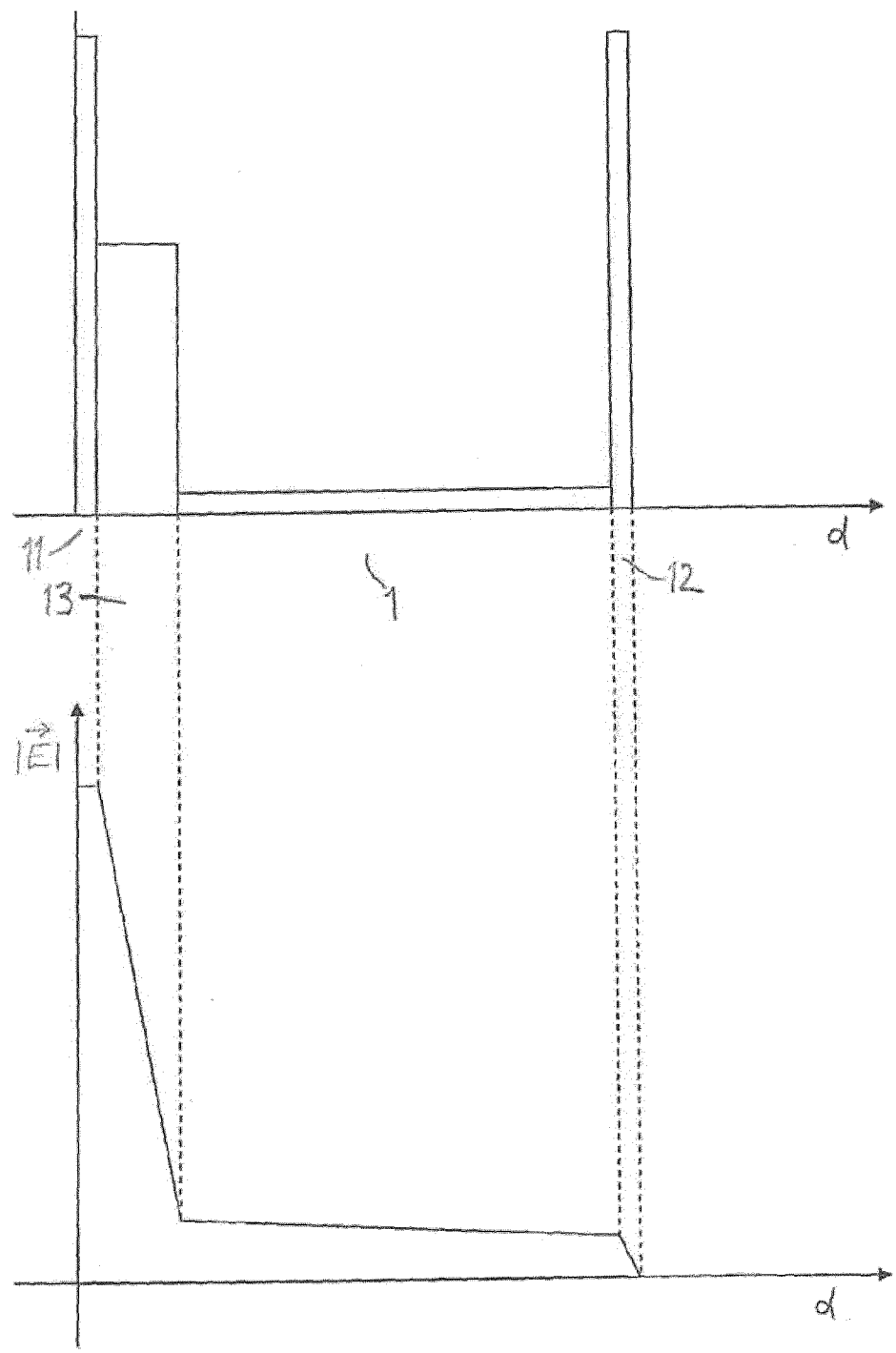
FIG. 15 shows a diagram of the doping concentration and the electric field strength.

FIG. 15 shows a schematic diagram of the doping concentration "c", measured in $cm^{-3}$, and the absolute value of the electric field "|E|" during the operation of the device, measured in $V\,m^{-1}$, as a function of the distance "d" from the sidewall of the trench 4, measures in µm, as a typical example. The sections that are divided by broken lines correspond to the first, second and third doped regions 11, 12, 13 and to the intermediate region of the substrate 1. FIG. 15 shows that the doping concentration is typically highest in the first doped region 11 and the second doped region 12, which are of opposite types of conductivity. The third doped region 13, which is preferably used as an avalanche multiplication region, is substantially higher doped than the region of the substrate 1 in between. This results in an electric field strength that continually decreases in the third doped region 13 with increasing distance from the first doped region 11 and has a very low value outside the first and third doped regions 11, 13. The low value of the electric field strength in the substrate 1 outside the avalanche multiplication region is a typical feature of this device and is especially advantageous.

Advantages of the described lateral avalanche photodiode device are, among others, a high quantum efficiency and a large absorption and multiplication volume. It is also advantageous that the electric field strength is largely independent of the thickness of the substrate, which allows an exceptionally wide applicability of the device.

An electric field that is strong enough for the generation of avalanche multiplication can be achieved by applying an appropriately high voltage, which can be provided by a high-voltage CMOS logic, for example. Device parameters like the distance between the doped regions 11, 12 and the thickness of the substrate 1 or, in a threedimensional integration, the arrangement of the interconnects 9 may be chosen in a suitable way to adjust the properties of the device according to the requirements. For example, in the case of a vertical reach-through avalanche photodiode device, the thickness of the substrate 1 determines the distance between the doped regions 11, 12.

In a silicon substrate, electrons have a larger ionization rate than holes and are the preferred charge carriers to be driven by the electric field into the region of high electric field strength, where the avalanche multiplication takes place. A p-type absorbing region is therefore preferred in order to achieve higher gain. On the other hand, n-type intrinsically conductive FZ (floating zone) material is preferred for lower dark currents and longer minority carrier life-times. The choice of the start material—FZ or epitaxial layer, n-type or p-type—depends on the requirements of the individual application. All embodiments of the described avalanche photodiode device can be realized in different materials and can particularly be processed in n-type as well as in p-type intrinsically conducting silicon.

The avalanche photodiode device can be manufactured with a conventional CMOS process. The threedimensional integration of the avalanche photodiode device of the presented invention allows an optimised process flow for both the avalanche photodiode device and an electric circuit used in conjunction with the photodiode. It enables the use of a dedicated start material, particularly a semiconductor substrate of intrinsic conductivity, for the avalanche photodiode devices, whereas the circuitry, which may comprise a high-voltage CMOS logic, for example, can be processed in a start material which is conventionally used for integrated circuits. The thickness of the substrate 1 used for the avalanche photodiode device and consequently the properties of the avalanche photodiode that depend on this thickness can be easily changed according to customer specifications without influencing the CMOS logic. It is thus easily possible to adapt avalanche photodiode and CMOS circuit independently to individual requirements. Furthermore, a high integration density of avalanche photodiodes can be achieved if the circuit is provided in a separate substrate. This is particularly favorable for arrays of photodiodes, which may be used in image sensors.

Examples of methods of producing the lateral avalanche photodiode device will now be described in conjuncting with FIGS. 16 to 27. The description of the method also discloses further features of embodiments of the device.

Figure 16:
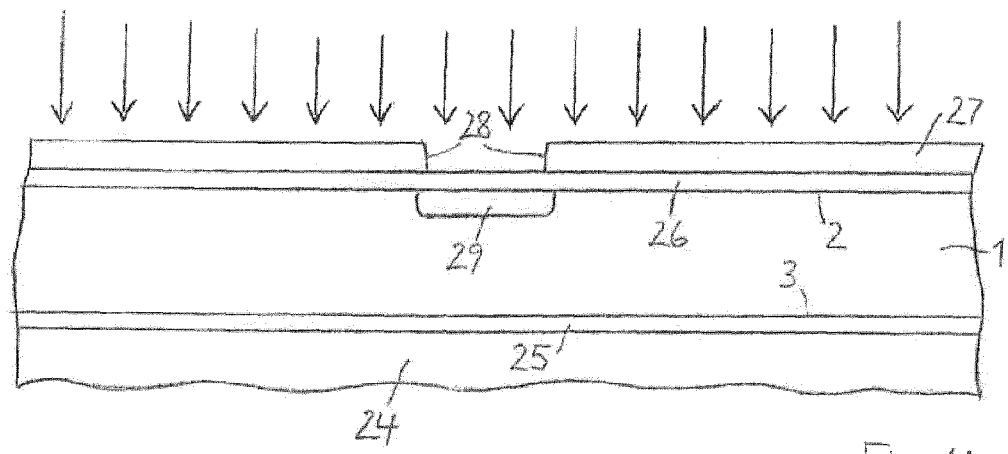
FIG. 16 shows a cross-section of an intermediate product of a method of producing the lateral avalanche photodiode device.

FIG. 16 shows a cross-section of an intermediate product of a method of producing the lateral avalanche photodiode device. The semiconductor substrate 1 may be fastened to a handling wafer 24 with a dielectric layer 25 arranged between the handling wafer 24 and the substrate 1. The substrate 1, the handling wafer 24 and the dielectric layer 25 may be an SOI substrate (silicon on insulator) with the dielectric layer 25 forming the insulating layer. The substrate 1 may especially be float zone silicon, which is known per se. The substrate 1 is provided with a low doping concentration for a first type of conductivity, preferably n-type conductivity, which may be an intrinsic conductivity of the semiconductor material. The main surface 2 may be covered with a dielectric layer 26, which may be a silicon dioxide, for instance.

A mask 27 having a window 28 is applied above the main surface 2 to mask a subsequent implantation of a dopant for the first type of conductivity. In FIG. 16 the implantation is indicated by arrows. Thus an implanted region 29 is formed, which is afterwards extended to the rear surface 3 by a diffusion of the dopant.

Figure 17:
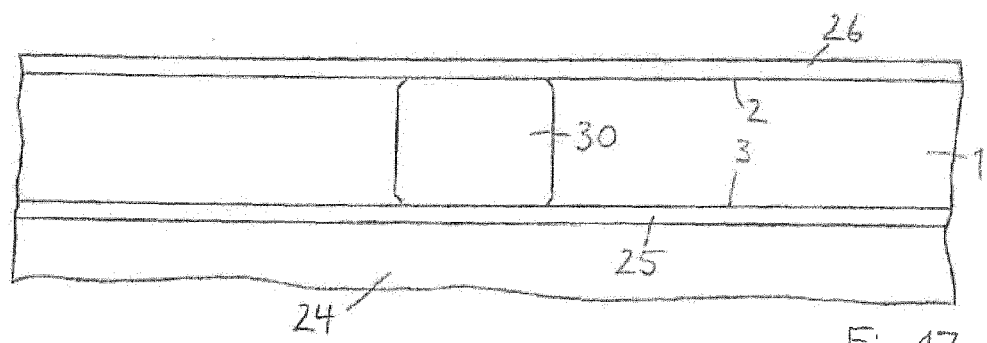
FIG. 17 shows a cross-section according to FIG. 16 after the formation of a doped region.

FIG. 17 shows a cross-section according to FIG. 16 after the removal of the mask 27 and the formation of a doped region 30 of the first type of conductivity by a diffusion of the implanted dopant. The doped region 30 extends from the main surface 2 through the substrate 1 to the rear surface 3.

Figure 18:
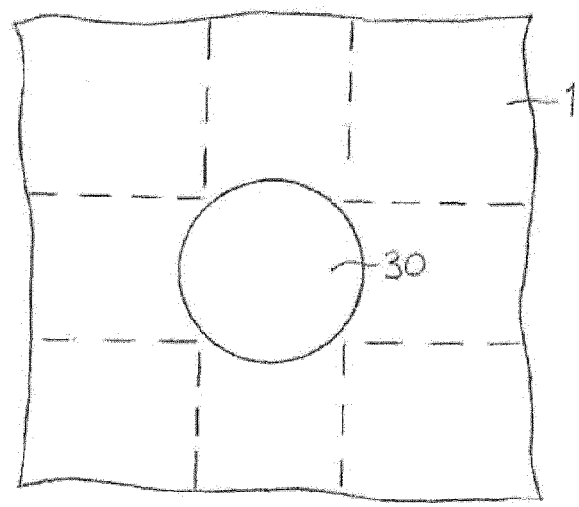
FIG. 18 shows a schematic plan view of the intermediate product according to FIG. 17.

FIG. 18 shows a schematic plan view of the intermediate product according to FIG. 17. If a single photodiode like the embodiments according to FIG. 11 or 12 is produced, the doped region 30 may be laterally omnidirectionally confined as shown in FIG. 18. Instead, the doped region 30 may be provided for an array of photodiodes and shaped like the trench 4 in the embodiment according to FIG. 14. The alternative shape of the doped region 30 is indicated in FIG. 18 by the broken lines.

Figure 19:
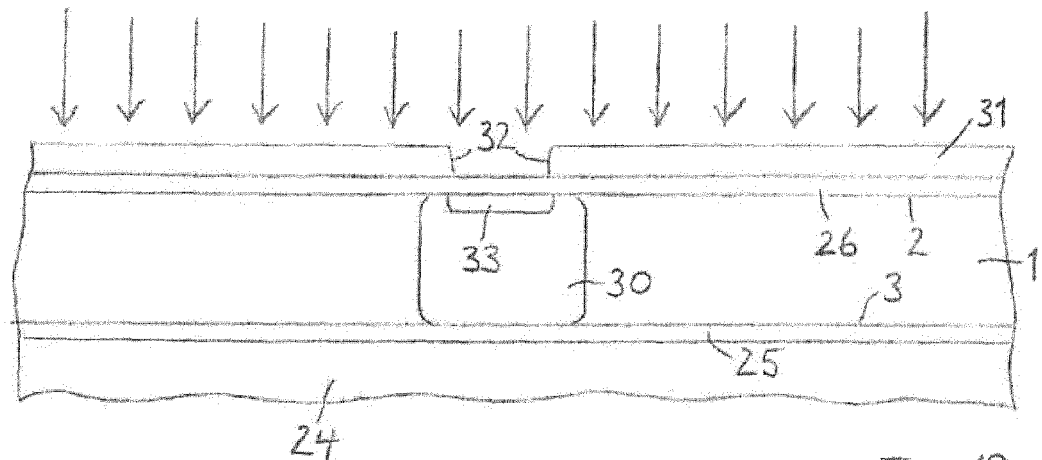
FIG. 19 shows a cross-section according to FIG. 17 after an implantation of a dopant.

FIG. 19 shows a cross-section according to FIG. 17 after a further implantation of a dopant. A further mask 31 having a window 32 is applied above the main surface 2 to mask an implantation of a dopant for the opposite second type of conductivity. In FIG. 19 the further implantation is indicated by arrows. Thus a further implanted region 33 is formed within the doped region 30.

Figure 20:
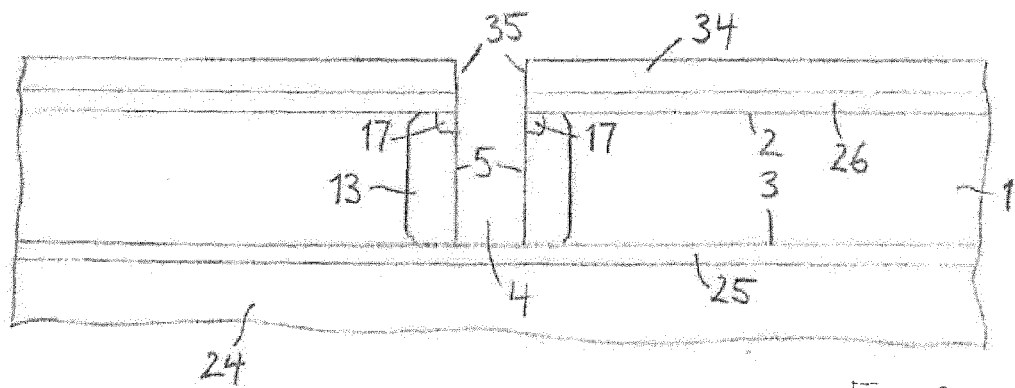
FIG. 20 shows a cross-section according to FIG. 19 after the formation of a trench.

FIG. 20 shows a cross-section according to FIG. 19 after the formation of a trench 4. A further mask 34 having a window 35 is applied above the main surface 2 to mask etching steps, by which first the dielectric layer 26 and then the semiconductor material of the substrate 1 are locally removed in the area of the trench 4 until the rear surface 3 is reached. The dielectric layer 25 preferably serves as etch stop layer to limit the etching of the trench 4. Instead, especially if no SOI substrate is used, the substrate 1 may be a moderately doped or intrinsically conductive layer which is epitaxially grown on a bulk substrate, and the boundary between the bulk substrate and the epitaxial layer may serve as etch stop layer. The trench 4 is produced in such a way that portions of the doped region 30 and of the further implanted region 33 remain adjacent to the trench 4. The remaining portion of the doped region 30 forms the third doped region 13, and the remaining portion of the further implanted region 33 forms the contact region 17 of the first doped region 11.

Figure 21:
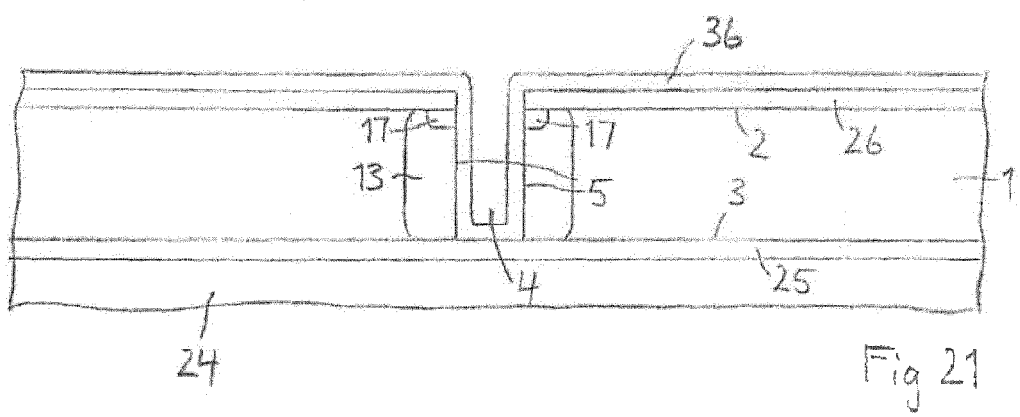
FIG. 21 shows a cross-section according to FIG. 20 after the application of a doped polysilicon layer.

FIG. 21 shows a cross-section according to FIG. 20 after the application of a doped polysilicon layer 36 of the second type of conductivity. The polysilicon layer 36 is applied in such a way that it is in electrical connection with the contact region 17. The polysilicon layer 36 is then removed from above the substrate 1, which can be done by etching, so that a remaining portion of the polysilicon layer 36 is located at the side wall of the trench 4. The polysilicon layer 36 may be left on the bottom of the trench 4 to form an electrically conductive bottom layer 23. Instead, as shown in the following figures, the polysilicon layer 36 may be removed from the bottom of the trench 4.

Figure 22:
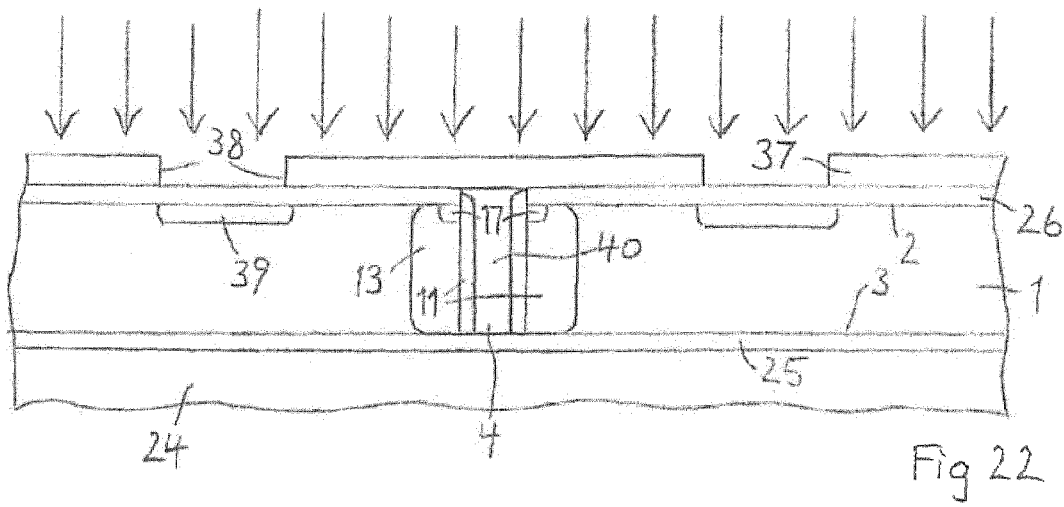
FIG. 22 shows a cross-section according to FIG. 21 after a further implantation of a dopant.

FIG. 22 shows a cross-section according to FIG. 21 after the partial removal of the polysilicon layer 36 and a filling of the trench 4 with a dielectric filling 40, which may be silicon dioxide, for instance. A further implantation of a dopant for the first type of conductivity is performed using a further mask 37 having a window 38 at a distance from the trench 4. Thus a further implanted region 39 is formed in the substrate 1 at a distance from the third doped region 13.

Figure 23:
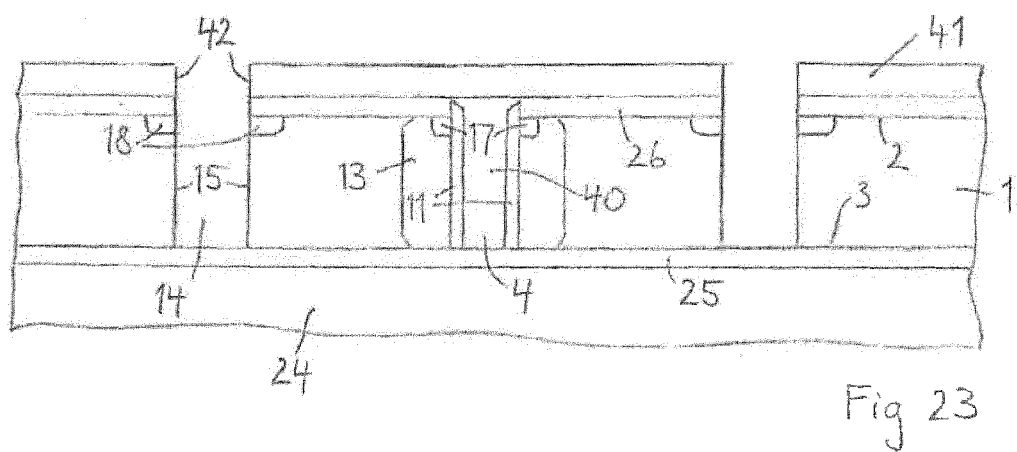
FIG. 23 shows a cross-section according to FIG. 22 after the formation of a further trench.

FIG. 23 shows a cross-section according to FIG. 22 after the formation of a further trench 14 using a further mask 41 having a window 42. First the dielectric layer 26 and then the semiconductor material of the substrate 1 are locally removed in the area of the further trench 14 until the rear surface 3 is reached. The dielectric layer 25 preferably serves as etch stop layer to limit the etching of the further trench 14. Instead, the boundary between a bulk substrate and an epitaxial layer may serve as etch stop layer, as explained above. The further trench 14 is produced in such a way that a portion of the further implanted region 39 remains adjacent to the further trench 14. The remaining portion of the further implanted region 39 forms the contact region 18 of the second doped region 12.

Figure 24:
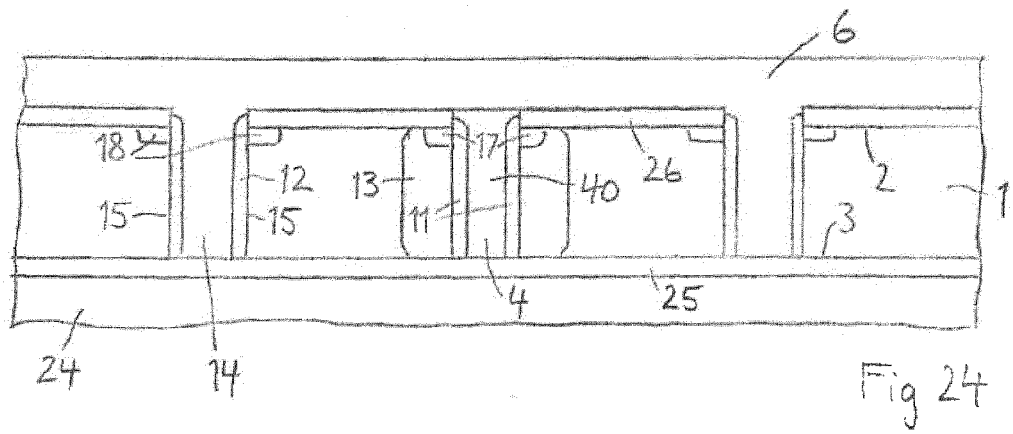
FIG. 24 shows a cross-section according to FIG. 23 after the application of a further doped polysilicon layer.

FIG. 24 shows a cross-section according to FIG. 23 after the application of a further doped polysilicon layer to form the second doped region 12 on the side wall 15 of the further trench 14. This step may be performed in a similar way as in the production of the first doped region 11. A dielectric layer 6, which may be silicon dioxide, may be applied to fill the further trench 14 and to cover the surface of the device.

The doped polysilicon layers may be used to fill the trench 4, the further trench 14 or both trenches 4, 14 in order to produce an embodiment according to FIG. 8 or 9. The order of the production of the first doped region 11 and the production of the second doped region 12 may be reversed.

Figure 25:
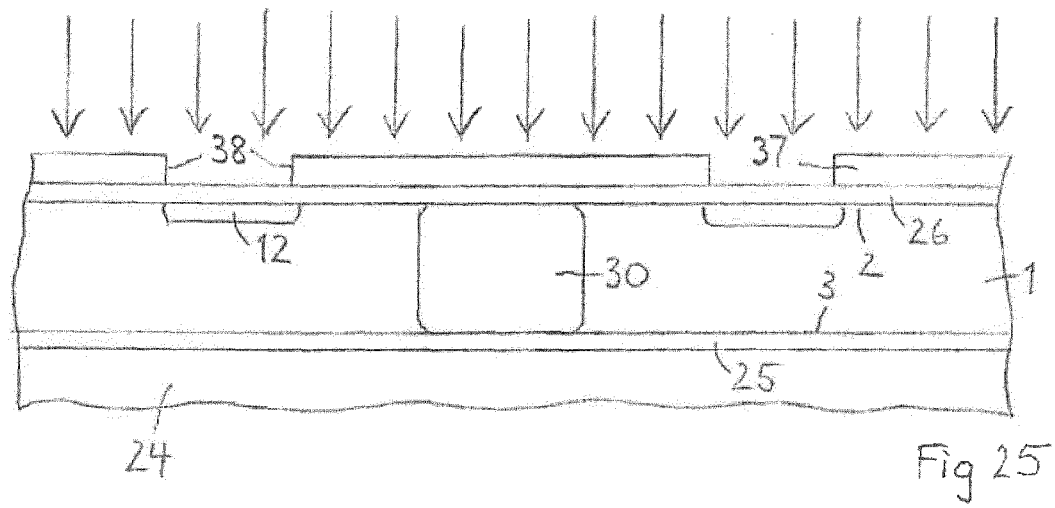
FIG. 25 shows a cross-section according to FIG. 19 for a further method.

FIG. 25 shows a cross-section according to FIG. 19 for a further method, which is suitable to produce embodiments according to FIGS. 5 to 7. After the formation of the doped region 30 a further mask 37 having a window 38 is applied above the main surface 2 to mask an implantation of a dopant for the first type of conductivity to produce the second doped region 12. In FIG. 25 the further implantation is indicated by arrows.

Figure 26:
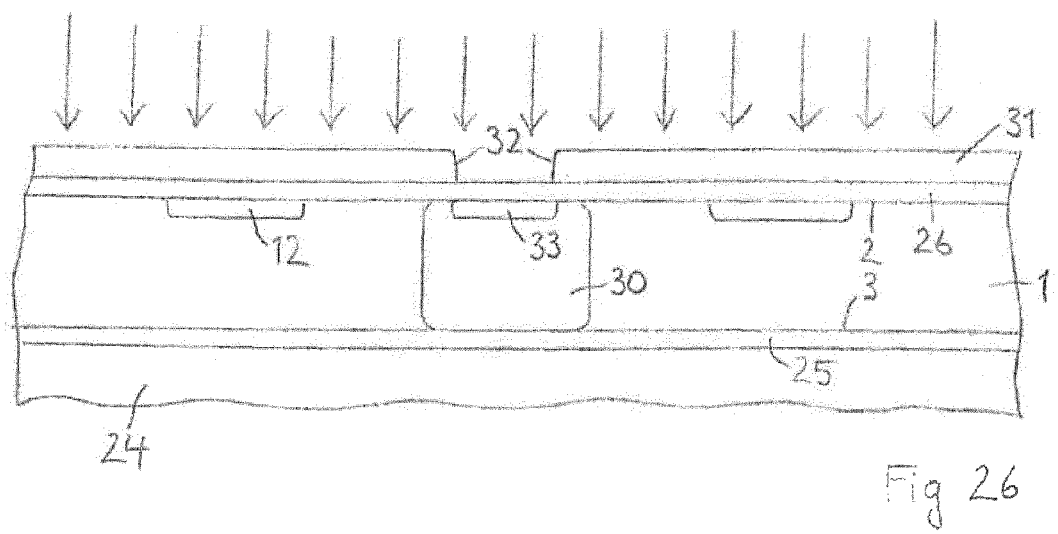
FIG. 26 shows a cross-section according to FIG. 25 after a further implantation of a dopant.

FIG. 26 shows a cross-section according to FIG. 25 after a further implantation of a dopant for the opposite second type of conductivity. This process step is similar to the process step shown in FIG. 19, except for the presence of the second doped region 12.

Figure 27:
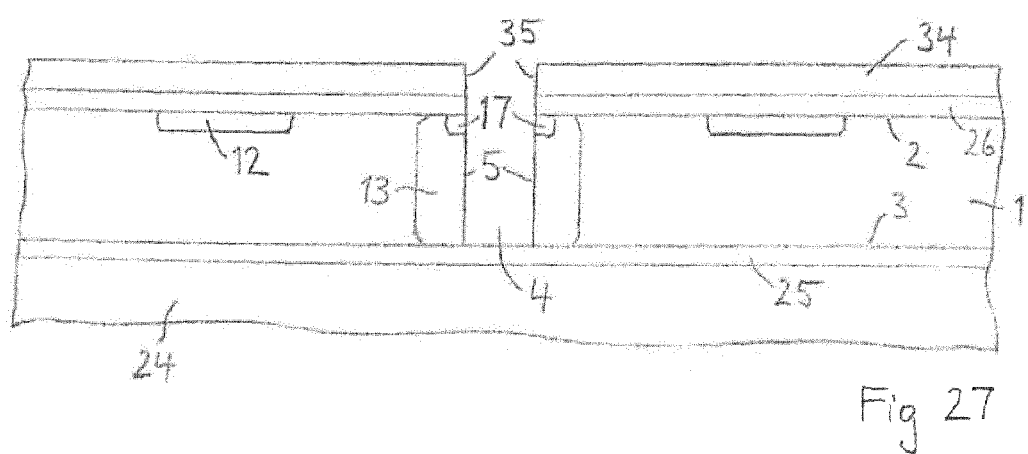
FIG. 27 shows a cross-section according to FIG. 26 after the formation of a trench.

FIG. 27 shows a cross-section according to FIG. 26 after the formation of the trench 4. This process step is similar to the process step shown in FIG. 20, except for the presence of the second doped region 12. The first doped region 11 may then be formed by a doped polysilicon layer as described above. The order of the production of the first doped region 11 and the production of the second doped region 12 may be reversed.

The vias 7 and contact pads 10 may then be formed, and a further substrate 20 may be bonded to the device for threedimensional integration as described above. The handling wafer 24 is preferably removed to reduce the overall dimension of the device and to permit backside illumination.

LIST OF REFERENCE NUMERALS 1 substrate
2 main surface
3 rear surface
4 trench
5 side wall
6 dielectric layer
7 via
8 integrated circuit
9 interconnect
10 contact pad
11 first doped region
12 second doped region
13 third doped region
14 further trench
15 side wall
16 passivation layer
17 contact region of the first doped region
18 contact region of the second doped region
19 connection layer
20 further substrate
21 first electrical contact
22 second electrical contact
23 bottom layer
24 handling wafer
25 dielectric layer
26 dielectric layer
27 mask
28 window
29 implanted region
30 doped region
31 mask
32 window
33 implanted region
34 mask
35 window
36 doped polysilicon layer
37 mask
38 window
39 implanted region
40 dielectric filling
41 mask
42 window
43 pixel

The invention claimed is:
1. A lateral avalanche photodiode device, comprising:
a semiconductor substrate (1) with a main surface (2) and a rear outer surface (3) opposite to the main surface (2),
a trench (4) with a side wall (5) in the substrate (1),
a first doped region (11) at the side wall (5) of the trench (4),
a second doped region (12) at a distance from the first doped region (11),
a third doped region (13) contiguous to the first doped region (11), the third doped region (13) arranged between the first doped region (11) and the second doped region (12),
the second doped region (12) and the third doped region (13) having a first type of conductivity, and
the first doped region (11) having a second type of conductivity which is opposite to the first type of conductivity,
characterized in that
the trench (4) and the first doped region (11) extend through the substrate (1) from the main surface (2) to the rear outer surface (3) and
the substrate (1) is of the first type of conductivity between the first doped region (11) and the second doped region (12).

2. The lateral avalanche photodiode device of claim 1, wherein
the third doped region (13) extends through the substrate (1) from the main surface (2) to the rear outer surface (3) and
the conductivity of the third doped region (13) is higher than the conductivity of the substrate (1) between the second doped region (12) and the third doped region (13).

3. The lateral avalanche photodiode device of claim 2, wherein
the third doped region (13) is provided as an avalanche multiplication region of elevated conductivity, making the avalanche photodiode a reach-through avalanche photodiode.

4. The lateral avalanche photodiode device of one of claims 1 to 3, wherein
the first type of conductivity is n-type conductivity and the second type of conductivity is p-type conductivity.

5. The lateral avalanche photodiode device of claim 1, wherein
the second doped region (12) is arranged within the substrate (1) at the main surface (2) and not extending to the rear outer surface (3).

6. The lateral avalanche photodiode device of claim 1, further comprising:
a further trench (14) with a side wall (15) in the substrate (1),
the second doped region (12) being arranged at the side wall (15) of the further trench (4) and
the further trench (14) and the second doped region (12) extending through the substrate (1) from the main surface (2) to the rear outer surface (3).

7. The lateral avalanche photodiode device of claim 1, wherein
the main surface (2) is planar,
the first and second doped regions (11, 12) are rotationally symmetrical and coaxially arranged, and
either the first doped region (11) surrounds the second doped region (12) or the second doped region (12) surrounds the first doped region (11) in at least one plane that is coplanar to the main surface (2).

8. The lateral avalanche photodiode device of claim 1, wherein
the trench (4) divides the substrate (1) into pixels (43).

9. The lateral avalanche photodiode device of claim 1, further comprising:
a first electrical contact (21) on the first doped region (11), and
a second electrical contact (22) on the second doped region (12).

10. The lateral avalanche photodiode device of claim 9, further comprising:
a further substrate (20) arranged above the main surface (2),
an integrated circuit (8) in the further substrate (20),
the electrical contacts (21, 22) being electrically connected with the integrated circuit (8) by means of interconnects (9) leading through the further substrate (20).

11. A method of producing a lateral avalanche photodiode device, comprising the steps of:
  providing a semiconductor substrate (1) with a low doping of a first type of conductivity,
  forming a doped region (30) of the first type of conductivity in the substrate (1),
  forming, in any order of sequence, a first doped region (11) and a second doped region (12) by
  forming a trench (4) with a side wall (5) in the doped region (30), the trench extending through the substrate (1) from a main surface (2) to a rear outer surface (3),
  applying a doped polysilicon layer (36) of a second type of conductivity which is opposite to the first type of conductivity to the side wall (5) of the trench (4) as the first doped region (11), and
  forming the second doped region (12) of the first type of conductivity at a distance from the doped region (30), in such a way that
  a remaining portion of the doped region (30) is a third doped region (13) contiguous to the first doped region (11), the third doped region (13) being arranged between the first doped region (11) and the second doped region (12).

12. The method of claim 11, wherein
the second doped region (12) is formed by an implantation of a dopant for the first type of conductivity.

13. The method of claim 11 or 12, further comprising:
  before the trench (4) is formed, forming a contact region (17) of the second type of conductivity at the main surface (2) within the doped region (30), and
  forming the first doped region (11) in electrical connection with the contact region (17).

14. The method of claim 11, further comprising:
  forming a further trench (14) with a side wall (15) at a distance from the doped region (30), and
  applying a doped polysilicon layer of the first type of conductivity to the side wall (15) of the further trench (14) as the second doped region (12).

15. The method of claim 14, further comprising:
  before the trench (4) is formed, forming a contact region (17) of the second type of conductivity at the main surface (2) within the doped region (30),
  forming the first doped region (11) in electrical connection with the contact region (17) of the second type of conductivity,
  before the further trench (14) is formed, forming a contact region (18) of the first type of conductivity at the main surface (2) at a distance from the doped region (30), and
  forming the second doped region (12) in electrical connection with the contact region (18) of the first type of conductivity.

* * * * *